United States Patent [19]

Neugebauer et al.

[11] Patent Number: 5,291,066
[45] Date of Patent: Mar. 1, 1994

[54] MOISTURE-PROOF ELECTRICAL CIRCUIT HIGH DENSITY INTERCONNECT MODULE AND METHOD FOR MAKING SAME

[75] Inventors: Constantine A. Neugebauer, Schenectady; Herbert S. Cole, Burnt Hills; Eugene L. Bartels, Elnora; Raymond A. Fillion, Schenectady, all of N.Y.

[73] Assignee: General Electric Company, Schenectady, N.Y.

[21] Appl. No.: 791,690

[22] Filed: Nov. 14, 1991

[51] Int. Cl.$^5$ .............................................. H01L 23/02
[52] U.S. Cl. ................................... 257/750; 257/758; 257/759
[58] Field of Search ................... 357/74, 72; 257/750, 257/758, 759, 760, 649; 428/414

[56] References Cited

U.S. PATENT DOCUMENTS

| | | | |
|---|---|---|---|
| 3,834,793 | 9/1974 | McConnell et al. | 350/160 R |
| 4,058,430 | 11/1977 | Suntola et al. | 156/611 |
| 4,755,866 | 7/1988 | Marshall et al. | 357/74 |
| 4,783,695 | 11/1988 | Eichelberger et al. | 257/668 |
| 4,907,062 | 3/1990 | Fukushima | 357/72 |
| 4,918,811 | 4/1990 | Eichelberger et al. | 29/840 |
| 4,930,042 | 6/1990 | Eichelberger et al. | 156/239 |
| 4,937,203 | 6/1990 | Eichelberger et al. | 437/51 |
| 4,960,613 | 10/1990 | Cole et al. | 427/53.1 |
| 4,988,412 | 1/1991 | Liu et al. | 204/15 |
| 5,002,818 | 3/1991 | Licari et al. | 428/414 |
| 5,108,825 | 4/1992 | Wojnarowski et al. | 428/209 |
| 5,127,998 | 7/1992 | Cole et al. | 205/135 |

OTHER PUBLICATIONS

"Atomic Layer Epitaxy", Colin H. L. Goodman, Markus V. Pessa, J. Appl. Phys. 60(3), Aug. 1, 1986, pp. R65–R81.

"Atomic Layer Epitaxy", Tuomo Suntola, Jaakko Hyvarinen, Ann. Rev. Mater. Sci. 1985, pp. 177–195.

"Laser-Induced Selective Copper Deposition on Polyimide", H. S. Cole, Y. S. Liu, J. W. Rose, R. Guida, Appl. Phys. Lett. 53(21), Nov. 21, 1988, pp. 2111–2113.

"Deposition of Refractory Metal Films by Rare-Gas Halide Laser Photodissociation of Metal Carbonyls", Diane K. Flynn, Jeffrey I. Steinfeld, J. Appl. Phys. 59(11), Jun. 1, 1986, pp. 3914–3917.

"Patterned Photonucleation of Chemical Vapor Deposition of Al by UV-Laser Photodeposition", J. Y. Tsao, D. J. Ehrlich.

"Ultraviolet Photodecomposition for Metal Deposition: Gas Versus Surface Phase Processes", Thomas H. Wood, J. C. White, B. A. Thacker, Appl. Phys. Lett., vol. 42, No. 5, Mar. 1983, pp. 408–410.

R. R. Tummala and E. J. Rymaszewski, Microelectronics-An Overview, pp. 50–52, New York (1989).

Primary Examiner—Rolf Hille
Assistant Examiner—Roy Potter
Attorney, Agent, or Firm—Geoffrey H. Krauss; Howard A. Skaist

[57] ABSTRACT

A moisture-proof integrated circuit module includes at least one integrated circuit component in a high density interconnect (HDI) structure fabricated by applying to a substrate successive multiple ply sequences having a plurality of via holes therein. The sequences overlie the component(s) and the module substrate, and each sequence includes a dielectric film and a plurality of lands comprised of metal that extends into the vias of the sequence to provide electrical interconnections. The module includes at least one moisture barrier film to prevent penetration of moisture through the module to the circuit component(s).

15 Claims, 5 Drawing Sheets

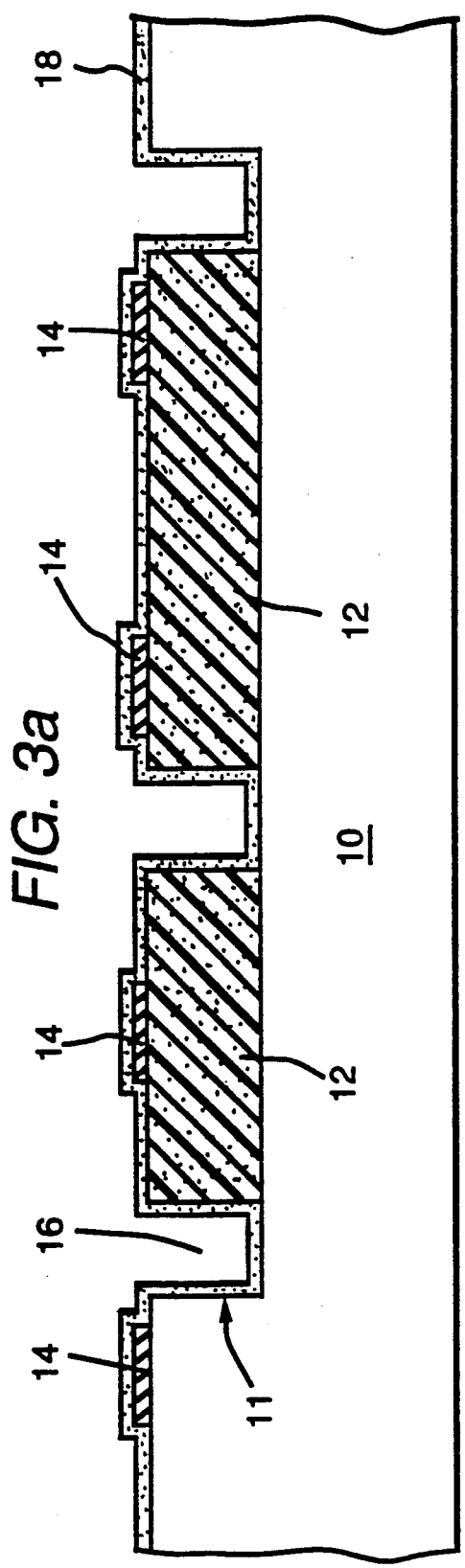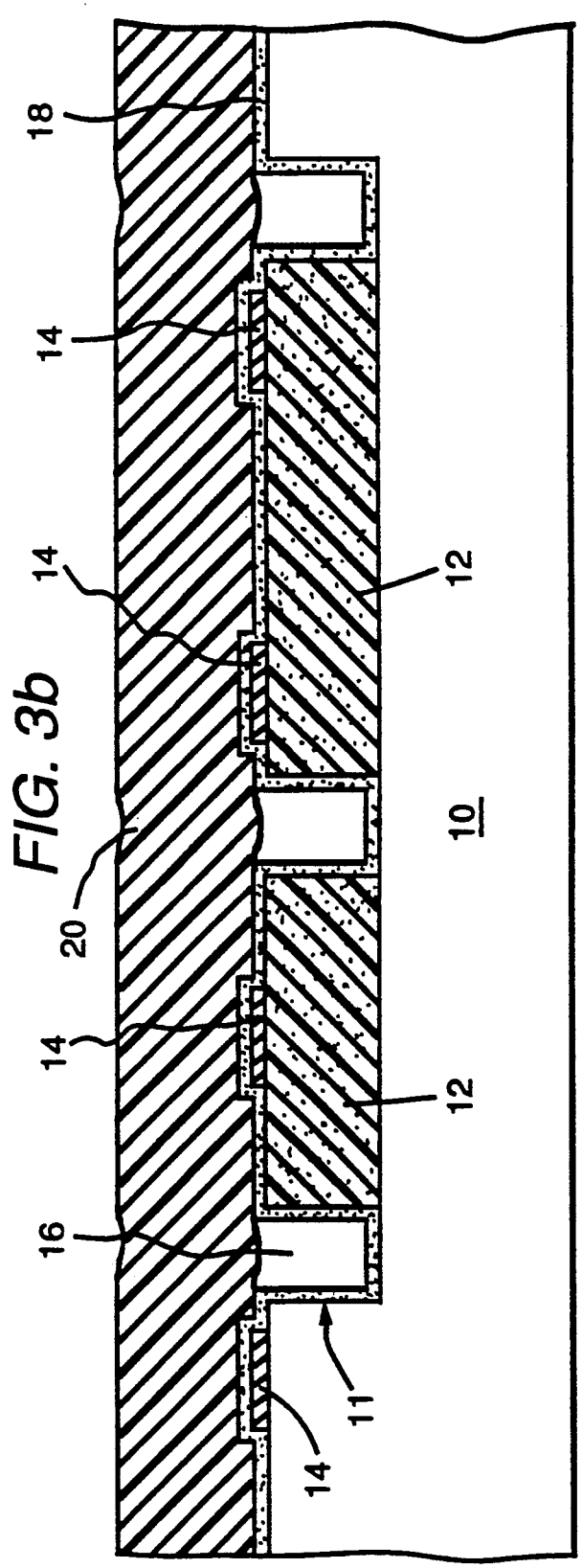

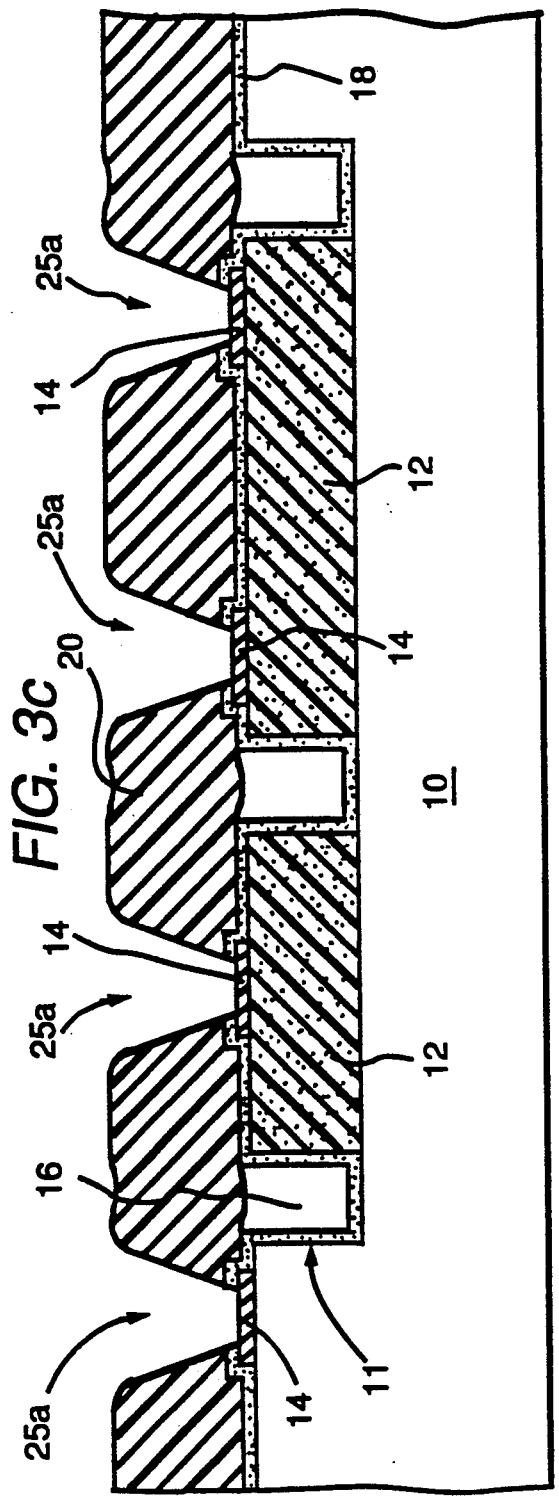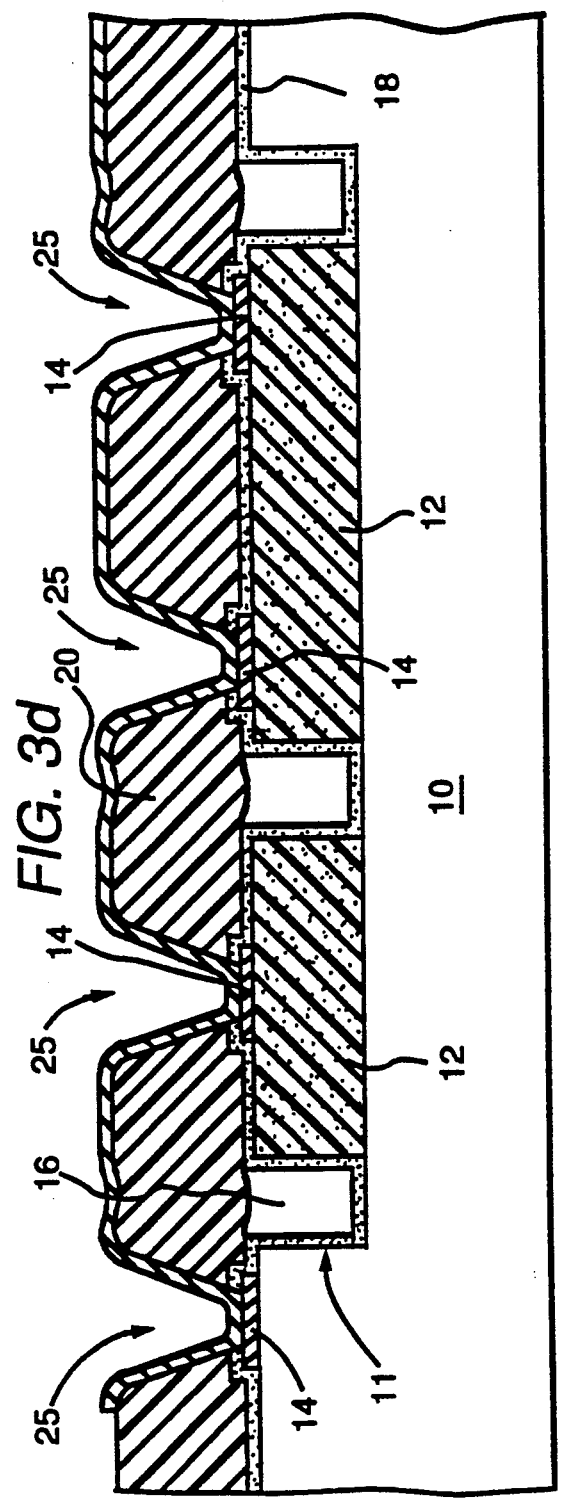

MOISTURE-PROOF ELECTRICAL CIRCUIT HIGH DENSITY INTERCONNECT MODULE AND METHOD FOR MAKING SAME

BACKGROUND OF THE INVENTION

This invention is generally directed to packaged or configured electrical components, such as very large scale integrated circuit (VLSI) chips, situated in a high density interconnect (HDI) structure. More particularly, the present invention relates to electrical circuit modules, such as integrated circuit modules, and a method of making the same, in which moisture is prevented from penetrating the module and reaching the electrical circuit components within the module.

HDI structures of the type mentioned above are shown and described in U.S. Pat. No. 4,783,695, "Multichip Integrated Circuit Packaging Configuration and Method," issued Nov. 8, 1988, and in U.S. Pat. No. 4,918,811, "Multichip Integrated Circuit Packaging Method," issued Apr. 24, 1990, both assigned to the assignee of the present invention and herein incorporated by reference. Such HDI structures, which may be built up in an integrated circuit module by means of multiple ply sequences stacked over the chips and the substrate, are subject to moisture penetration. In such a module each sequence includes at least a dielectric film and a metal layer which overlies the film and which makes the desired interchip and intrachip connections. Moisture that penetrates the module may corrode these connections, or contaminate the chips themselves, and reduce the overall reliability of the module.

Various measures have been devised to protect modules from such damage, such as placing the module inside a metal enclosure. Aside from its relatively high cost, a metal enclosure adds bulk and weight, offsetting some of the salient advantages associated with use of an HDI structure In accordance with another protection technique, the module is surrounded with a material, such as polymer. However, experience has shown that a polymer material is susceptible to moisture penetration on the molecular level.

SUMMARY OF THE INVENTION

In accordance with the present invention, a moisture-proof electrical circuit module, such as an integrated circuit module, is provided which incorporates a high density interconnect (HDI) structure. The module includes a substrate, at least one electrical circuit component, and an electrical interconnection structure. The electrical interconnection structure comprises successive multiple ply sequences overlying the electrical circuit components and the substrate of the module. Both the components and substrate are provided with interconnection pads. Each sequence includes at least a dielectric film, such as a polymer film, to provide electrical insulation, and a layer of metal which overlies the dielectric film and which provides high density electrical interconnections with the interconnection pads of the circuit components and the substrate. At least one of the sequences further includes a moisture barrier film, such as an inorganic oxide film, underlying the dielectric film. Thus, each sequence may include either a dielectric film or a dielectric film and a moisture barrier film in a film portion. A plurality of via holes extends through the film portion of each sequence. Each via hole is lined by the aforesaid metal layer to make contact with an exposed metal surface below the multiple ply sequence. The latter metal surface is formed either by the metal layer of the immediately underlying sequence, or by one of the aforementioned interconnection pads positioned immediately below. Thus, the metal layers and the metal-lined via holes establish high density electrical connections between selected interconnection pads.

A preferred method for fabricating the aforesaid module entails the build-up of successive multiple ply sequences over the circuit components and the substrate, each sequence being applied a single ply at a time. Prior to application of the metal layer in each sequence the via holes are formed, preferably at locations that are staggered with respect to the via holes in the adjacent sequence(s). Following application of the metal layer and before the next sequence is put in place, selected portions of the metal layer may be removed to form metal lands in only those areas where electrical contact is to be subsequently established. For additional moisture proofing an outer coating is deposited after the last sequence is applied. The outer coating contains at least a barrier film which overlies the top and sides of the electrical interconnection structure formed by the earlier-applied multiple ply sequences and this outer coating may extend to the substrate below.

OBJECTS OF THE INVENTION

One object of the present invention is to provide a moisture-proof electrical circuit HDI module, and a method for making the same, which requires no metallic enclosure.

Another object is to provide an electrical circuit module of improved overall reliability that incorporates an HDI structure.

An additional object is to provide a small, relatively light weight, easily fabricated electrical circuit HDI module which effectively resists moisture penetration and a low temperature process for fabricating such a module.

BRIEF DESCRIPTION OF THE DRAWINGS

The subject matter regarded as the invention is particularly pointed out and distinctly claimed in the concluding portion of the specification. The invention, however, both as to organization and method of fabrication, together with further objects and advantages thereof, may best be understood by reference to the following detailed description when read with the accompanying drawings in which:

FIG. 1b is an enlarged partial view of the module shown in FIG. 1a.

FIG. 2 is a plan view of an exemplary multiple ply sequence of the type shown in the module of FIG. 1a.

FIGS. 3a-3d are cross-sectional views providing a partial, schematic representation at different stages in the method of fabricating the module of the present invention.

DETAILED DESCRIPTION OF THE INVENTION

Figure 1A:
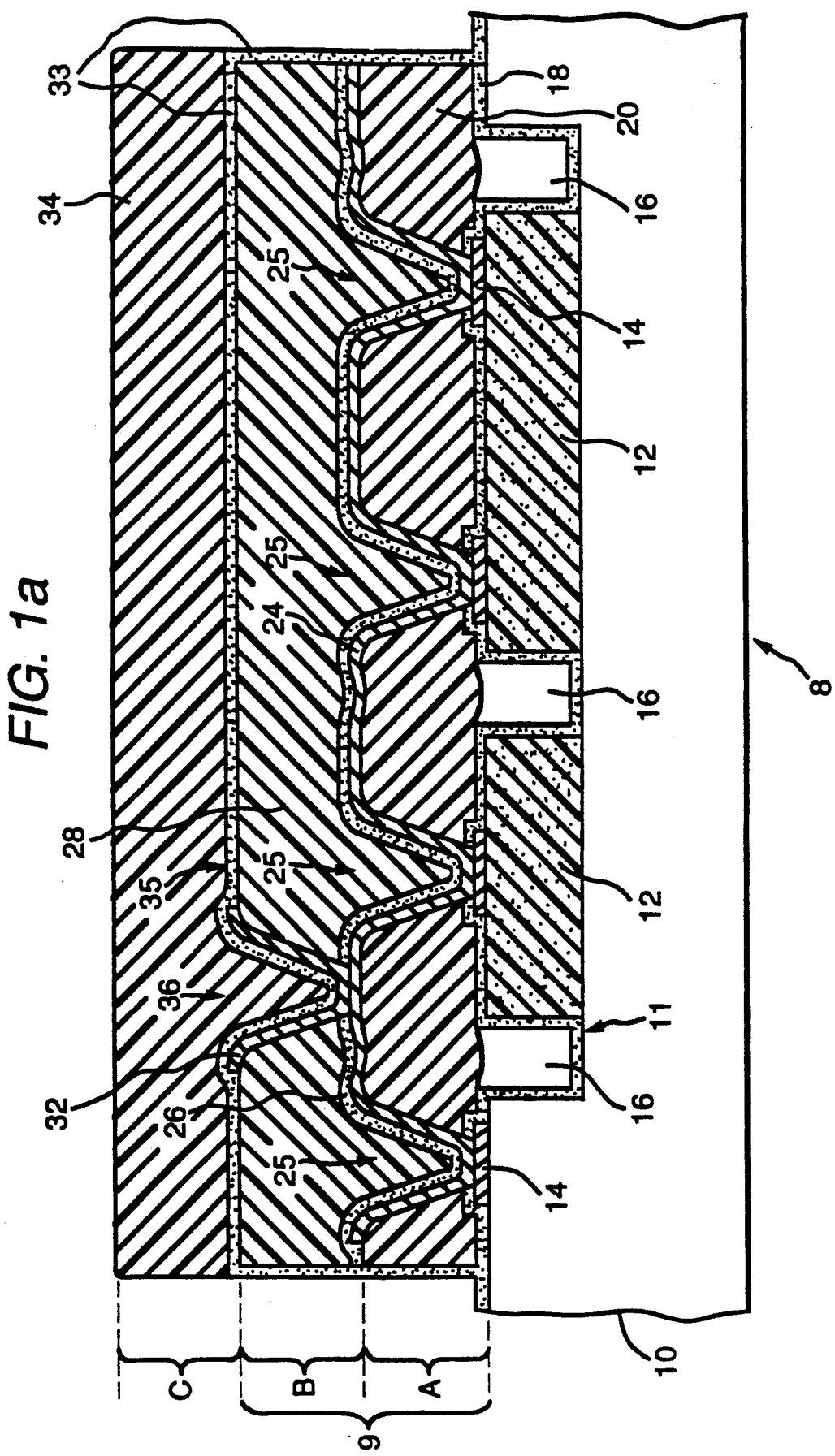
FIG. 1a is a cross-sectional view of a portion of an electrical circuit HDI module wherein the structure includes two multiple ply sequences that provide interchip and intrachip connections.
Figure 1B:
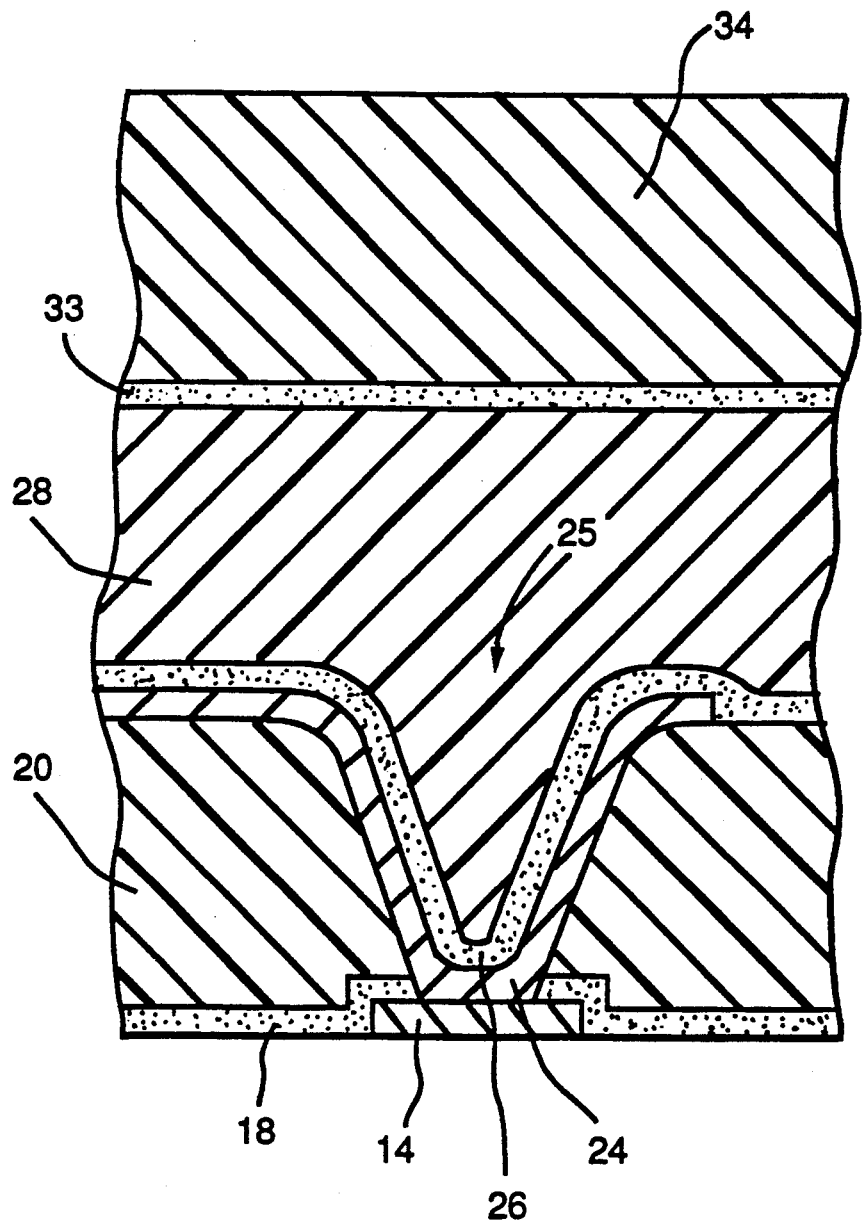

FIGS. 1a and 1b illustrate in cross-section a preferred embodiment of a moisture-proof HDI integrated circuit module 8. The module includes a substrate 10, a plurality of electrical circuit components, e.g. integrated circuit chips 12, and an electrical interconnection structure 9. Chips 12 are shown situated free standing, i.e. with spaces surrounding each chip, on the floor of a cavity 11 formed in substrate 10. Spaces 16 between the chips are shown exaggerated for reasons of clarity Metal interconnection pads 14 are shown disposed on chips 12 and substrate 10. The interconnection pad on substrate 10 typically provides an electrical connection between the electrical circuit components of the module and circuitry external to the module, such as a power source, ground contact, or input and output circuitry. It will be understood that each chip may have more than the one or two pads shown. Furthermore, the substrate may have more than one pad or it may have no pads at all.

Two multiple ply sequences A and B and an outer coating C are successively stacked over chips 12 and substrate 10. Sequences A and B form an electrical interconnection structure 9 within module 8. Sequence A comprises a pair of protective films 18 and 20 and a metal layer 24. The portion shown in FIG. 1a has four via holes 25, each aligned with a metal pad 14. Sequence B overlies sequence A and comprises protective films 26 and 28, and a metal layer 32. The portion shown contains a single via hole 36. Outer coating C overlies sequence B and comprises protective films 33 and 34. As shown, film 33 covers top surface 35 of multiple ply sequences A and B as well as all of the sides of electrical interconnection structure 9 formed by the sequences. Film 34 covers the portion of film 33 overlying top surface 35.

Films 18, 26 and 33 in sequences A and B and in outer coating C, respectively, comprise an inorganic oxide material and provide a barrier against the entry of moisture. Films 20, 28, and 34 comprise a dielectric polymer material. Film 20 provides electrical insulation between its adjacent metal layer 24 and chips 12, while film 28 provides electrical insulation between its adjacent metal layers 32 and 24.

Substrate 10 may comprise different types of materials, such as metals, alumina, ceramics, silicon, gallium arsenide, glass, plastic, or composites thereof. The portion of substrate 10 shown in FIG. 1a contains a single cavity 11 in which chips 12 are situated. It will be understood, however, that the substrate may have a plurality of cavities, or no cavities, and that chips 12 need not be disposed within a cavity, but may be situated on the surface of the substrate. Similarly, a single cavity may contain several chips 12, or only a single chip. Where a cavity is used, however, the depth is preferably such that the chips situated on the cavity floor extend upward to position the tops of the chips substantially even with the substrate surface. Depending on the requirements of the particular situation, chips of different heights may be situated within the same cavity. If so, they are preferably situated at different depths such that their top surfaces are even with the planar top surface of the substrate. While components 12 typically comprise integrated circuit chips, it will be understood that other electrical circuit components, such as capacitors or other passive or active electrical circuit elements, may, additionally or alternatively, be situated within a cavity. As shown in FIG. 1a, chips 12 are situated free standing, mutually spaced as well as spaced from the walls of the cavity, so as to leave a space 16 surrounding each chip, although it will be appreciated that space 16 may be filled with any appropriate insulating material, such as a dielectric polymer.

Moisture barrier film 18 in sequence A is seen to cover and conform to the contours of the surfaces of substrate 10, cavity 11, and chips 12, such as the side and top surfaces of the chips, as well as the bottom surface and side walls of the cavity. As already mentioned, film 18 comprises an inorganic oxide material, e.g. titanium oxide or silicon dioxide. Although film 18 provides some electrical insulation, its primary function is to block penetration of moisture, In a preferred embodiment, the thickness of film 18 is in the range of approximately 0.1 microns to 3 microns. While it is preferred that each multiple ply sequence of module 8 include an inorganic oxide barrier, cost considerations may militate against such a structure. However, presence of a barrier film in even a single sequence can provide effective protection against the entry of moisture. In the latter case, it is preferable that the barrier film be either in outer coating C, such as protective film 33, or be disposed adjacent the substrate, such as protective film 18.

As previously mentioned, barrier film 18 conforms to the contours of the surfaces of chips 12, cavity 11, and substrate 10. Polymer film 20, however, is deposited as a preformed solid film so as to bridge spaces 16 which can remain substantially empty. Film 20 provides the main body of electrical insulation beneath metal layer 24 in the embodiment of the invention shown in FIG. 1a. By way of example and without limitation, polymer film 20 may comprise a polyimide material such as KAPTON ® polyimide which is commercially available from E. I. duPont de Nemours & Co., Wilmington, Del. Film 20 is preferably bonded to barrier film 18 by means of a thermoplastic adhesive such as ULTEM ® polyetherimide resin, available from General Electric Co., Pittsfield, Mass. As previously explained, the barrier film may be placed elsewhere in the module. Where sequence A does not contain a barrier film, film 20 is bonded directly to the top surfaces of chips 12.

The nature of polymer film 20, including a method of its application, are described in greater detail in U.S. Pat. No. 4,933,042, "Method for Packaging Integrated Circuit Chips Employing a Polymer Film Overlay Layer," issued Jun. 12, 1990, which is assigned to the assignee of the present invention and is incorporated herein by reference. An important purpose of using a solid polymer film is to enhance removability of the outer coating and multiply ply sequences stacked on the chips and substrate, without damage to the chips. This capability allows replacement of electrical interconnection structure 9, or removal and repair, or replacement of the chips. Solid polymer film 20 bridges spaces 16 between adjacent chips and between the chips and the wall of cavity 11. However, polymer film 20 may alternatively be applied as a liquid so as to additionally fill spaces 16. The liquid film so applied is subsequently baked to remove solvents and, in some instances, to cure the film to render it substantially inert.

As shown, polymer film 20 presents a relatively flat surface to subsequently applied metal layer 24. In a preferred embodiment, the polymer films in all sequences are applied as solid films for reasons related to reliability and cost; however, as mentioned above with respect to polymer film 20, the polymer films of the multiple ply sequences overlying sequence A may each be deposited as a liquid and baked. The thickness of each polymer film, whether deposited in liquid or in solid form, is in the range of approximately 5 microns to 50 microns.

As mentioned above, each multiple ply sequence includes via holes 25, best shown in the enlarged partial view of FIG. 1a. Each via hole is formed as a through-hole in the film portion of its sequence, preferably conical in shape with gently sloping interior walls. For example, in the film portion of sequence A, which includes film 18 and film 20, via hole 25 extends through the film portion to expose an underlying metal surface. As apparent in the enlarged view shown in FIG. 1b, interconnection pad 14, which (as shown in FIG. 1a) may reside on either chip 12 or on substrate 10, forms the aforesaid metal surface. Via hole 25 is lined by metal layer 24 to establish a conductive link between this metal layer and the aforesaid exposed metal surface of pad 14 beneath the film portion. It will be understood that the via holes in sequence A are placed only where an interconnection pad is to be electrically connected. Thus if chip 12 should have additional pads, such additional pads may remain unconnected.

In multiple ply sequences remote from substrate 10, such as sequence B, the metal surfaces exposed by the via holes of the particular sequence are formed by the metal layer of the underlying sequence. Where a sequence contains no inorganic oxide film, the via holes will perforate only the polymer film of the sequence to expose the underlying metal surface.

Although the via holes of successive multiple ply sequences may be aligned, in a preferred embodiment of the invention they are staggered with respect to each other. Further, since via holes represent potential entry points for moisture in each sequence, staggering them enhances the moisture-proofing aspect of the module.

Figure 2:
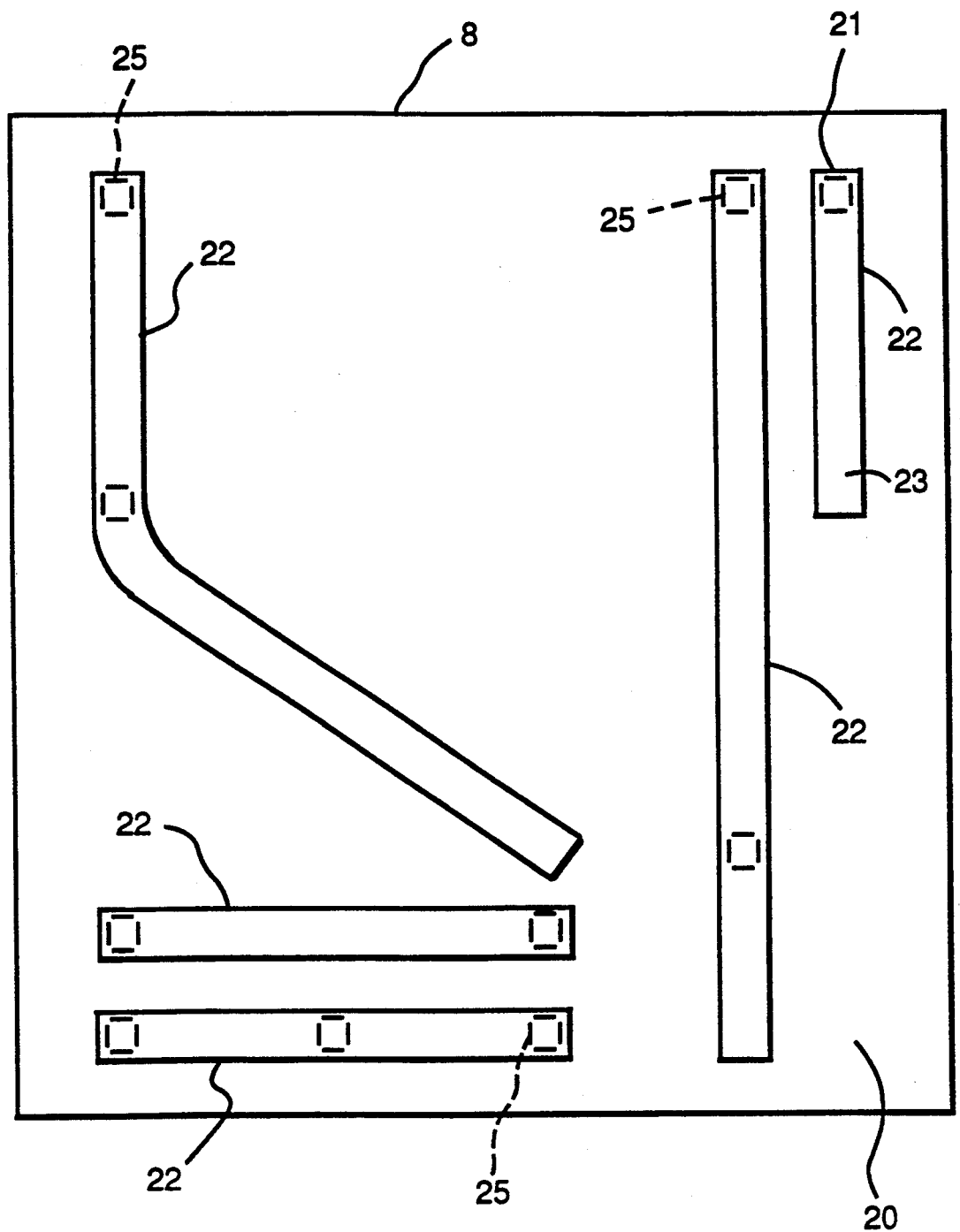

In sequence A, metal layer 24 overlies the film portion of the sequence, in contact with polymer film 20. Although it may be initially applied so as to cover the entire surface of film 20, in its final form metal layer 24 of FIGS. 1a and 1b may be formed into discrete, raised metal lands 22, as shown in FIG. 2, that overlie predetermined areas of the surface of polymer film 20. These lands 22 interconnect selected via holes positioned immediately above or immediately below the particular land. The interconnected via holes need not lie in the same plane. Thus, as shown in FIG. 2, end 23 of land 22 does not overlie a via hole in contrast with its opposite end 21 which does overlie a via hole. End 23 is positioned beneath a via hole (not shown) and thus it connects the overlying sequence to the one shown in FIG. 2. In FIG. 1a metal layer 24 is shown as a single continuous land.

As previously mentioned, each metal layer that lines the interior wall of the corresponding via holes 25 is conductively linked to the exposed metal surfaces below. As shown in FIGS. 1a and 1b, for sequence A the metal surfaces exposed by via holes 25 are presented by interconnection pads 14. Thus, each pad 14 is electrically connected to metal layer 24 which, as shown in FIG. 2, comprises discrete lands 22. In sequence B, as shown in FIG. 1a, metal layer 32 similarly overlies the polymer film of that sequence and contacts metal layer 24. Metal layer 32, in similar manner to layer 24, comprises discrete metal lands over selected areas of polymer film 28. Polymer film 28 and the polymer film of all other multiple ply sequences, if any, subsequent to sequence A, may be deposited as a liquid or a solid film so as to fill the via holes of the immediately underlying multiple ply sequence. Layer 32 also provides the metal lining of via hole 36 to establish a conductive link with the exposed metal surface below, in this case a portion of land 22.

The arrangement as thus far described and illustrated includes electrical interconnections between the metal layers of successive sequences and, as desired, to chips 12 and any interconnection pads disposed on substrate 10. Thus, as shown in FIG. 1a, metal layer 32 makes electrical contact with metal layer 24 through via hole 36. Layer 24 in turn is connected through via holes 25 to interconnection pads 14. Thus, a high density interconnect structure is achieved which permits communication between chips 12 and circuitry external to module 8, while resisting penetration of moisture without unduly increasing the weight and bulk of the module.

In addition to their electrical interconnection function, metal layers 24 and 32 also assist in preventing penetration of moisture into the HDI structure by forming a seal over via holes 25 and 36, respectively. This aspect of the present invention further assures reliability of module 8, notwithstanding the fact that via holes 25 and 36 extend through moisture barrier films 18 and 26, respectively.

In a preferred embodiment of the invention, metal layers 24 and 32 may each comprise several metal sublayers overlying one another in sequence, such as a titanium-copper-titanium combination. Thicknesses of the titanium and copper sublayers may be in the range of approximately 0.05 microns to 0.2 microns, and approximately 0.2 microns to 20 microns, respectively, such that metal layers 24 and 32 may each have an overall thickness in the range of approximately 0.3 microns to 20.4 microns.

As shown in FIG. 1a, an outer coating C, including films 33 and 34, overlies top surface 35 as well as all sides of electrical interconnection structure 9. Where more than one multiple ply sequence is provided, the outer coating will overlie the multiple ply sequence positioned farthest from substrate 10. In a preferred embodiment, film 33 is a moisture barrier film and comprises an inorganic oxide material. As such, it provides the first barrier against entry of moisture into the module. In FIG. 1a, film 33 is seen to cover part of the upper surface of substrate 10.

Film 34 of outer coating C comprises a dielectric polymer material applied as a solid or liquid film as previously described, although again a solid film is preferred. Further, film 34 provides a protective coating for film 33 against various types of physical damage, such as scratching. As shown, film 34 covers only that portion of film 33 which is disposed over the top surface 35 of electrical interconnection structure 9. Although not shown in FIG. 1a, it will be understood that outer coating C may comprise moisture barrier film 33 only. Alternatively, coating C may include an additional moisture barrier film, which may overlie the electrical interconnection structure, including polymer film 34.

As those skilled in the art will appreciate, the present invention is also applicable to modules comprising a single electrical circuit component, such as a single integrated circuit chip. In that situation, the initial multiple ply sequence, or successive multiple ply sequences, provide a moisture-proof module in which the via holes and the metal layers are arranged for intrachip connections, and particular interconnection pads on the chip are connected to exterior pins on the module.

The moisture-proof module described hereinabove may be fabricated in a number of ways. In a preferred embodiment, the multiple ply sequences are built up over substrate 10 and chips 12, a single ply at a time. FIGS. 3a–3d provide partial, schematic cross-sectional representations of various stages in the fabrication of the module, specifically steps in the application of the first sequence. As shown in FIG. 3a, inorganic oxide barrier film 18 is deposited on an underlying surface which includes portions of substrate 10 and chips 12. The preferred method for depositing film 18 entails a low temperature chemical vapor deposition (CVD) process, sometimes referred to as atomic layer epitaxy (ALE). In general, an organometallic compound is heated in an enclosed environment to a temperature falling in the range of approximately 30° C. to 200° C. to form a substantially uniform coating of the desired metal oxide on the aforesaid underlying surface. In the ALE CVD process, sequential surface exchange reactions are used to deposit the metal oxide one monolayer at a time. The separation of reaction steps is performed by flowing a carrier gas over the substrate. The reactants are alternately injected into a vacuum chamber containing the substrate and, following each reaction, are purged by the carrier gas flow.

During the first phase of the protective film 18 deposition, the molecules of a compound, such as a metal halide, impact the substrate and are absorbed by the surface layer. This compound remains on the surface until the molecules of another reactant, such as water or oxygen, are injected into the vacuum chamber. When a sufficient activation energy level is reached in the chamber, an exchange reaction occurs which deposits a monolayer of the metal oxide on the substrate and releases the remaining chemical reaction constituents. The energy necessary to cause the reaction may be supplied thermally, photochemically, or by other methods. The cycle is repeated to deposit additional monolayers of the metal oxide.

It will be understood that whenever a sequence is to include a moisture barrier film, such film will, in all but the first-applied sequence, be deposited on a surface formed, sequence. Thus, referring to FIG. 1a, moisture barrier film 26 in sequence B is deposited on the metal lands of metal layer 24 of sequence A, substantially in the manner explained previously.

As shown in FIG. 3b, moisture barrier film 18 forms the underlying surface for polymer film 20 which is deposited in solid form directly on top of film 18 and is bonded to the high portions thereof. As previously explained and shown in FIG. 3b, hollow spaces 16 are formed beneath film 20 and may be left substantially unfilled.

A number of known methods may be used for bonding film 20 to its underlying surface, for example as disclosed in aforementioned U.S. Pat. No. 4,933,042. That technique requires use of a vacuum-pressure laminator. A thermoplastic adhesive is applied and then heated to at least it melting temperature. For example, a thin film of ULTEM 1000 polyetherimide resin and a solvent of methylene chloride and acetophenone may be sprayed onto film 20 and then dried for 5 minutes at a temperature in the range of approximately 200° C. to 300° C. to remove solvents. The resultant adhesive-coated film is then applied to the underlying surface, in this case to moisture barrier film 18, so as to form a lamination, as shown in FIG. 3b.

In addition to build-up of the first multiple ply sequence of the electrical interconnection structure, in which a solid polymer film is deposited, the polymer film is preferably deposited in solid form in all subsequent sequences, such as sequence B in FIG. 1a, and is bonded to its underlying surface, as explained above. Alternatively, in the sequences subsequent to the first-applied sequence, the polymer film is deposited as a liquid coating. In one such alternative method, a solution of polyimide dissolved in a solvent and mixed with a liquid epoxy and an epoxy curing agent may be sprayed or spun directly on the underlying surface. It is then dried for one-half hour at a temperature in the range of approximately 100° C. to 250° C. to remove the solvents, to cure the epoxy, and to form the dielectric film. In another alternative method for depositing the polymer film as a liquid, the mixture of ULTEM 1000 resin and solvents described above may be sprayed in three successive depositions and dried for 5 minutes at a temperature in the range of approximately 250° C. to 350° C. In still another alternative method for depositing the polymer film as a liquid, parylene is deposited by chemical vapor deposition. The substrate is heated in a vacuum of approximately 1 torr while a p-xylylene monomer is admitted in a controlled manner to form the parylene polymer coating on the exposed surfaces of the substrate.

While the foregoing explanation describes the polymer film as being deposited on an underlying oxide barrier film, it will be understood that the present invention is not so limited. Thus, the polymer film may be deposited in the manner described on different kinds of surfaces if the multiple ply sequence in question contains no moisture barrier film.

Following deposition of the film portion of the sequence, i.e. films 18 and 20 in the sequence under consideration, the film portion is perforated to form via holes 25a as shown in FIG. 3c. In a preferred method, particular locations of polymer film 20 are thermally or photochemically decomposed by a laser beam to form through-holes that expose moisture barrier film 18. The through-holes formed by this ablation of the polymer film are then extended through moisture barrier film 18 by using a wet chemical or plasma etching technique to expose the underlying metal surfaces. As stated above, in multiple ply sequence A these metal surfaces are provided by the underlying interconnection pads 14. In the multiple ply sequences remote from the substrate the metal surfaces are provided by the metal layer of the underlying sequence. The formation of via holes 25a also depends to some extent on the constituents of the sequence in question. In a sequence where the film portion does not include a moisture barrier film, the polymer film is ablated with the laser beam until the underlying metal surface is exposed.

As previously explained and as shown in FIG. 2, metal layer 24 of FIG. 1 includes discrete metal lands 22. Formation of a metal land is shown in FIG. 3d and may be carried out by a number of different methods. A preferred method, designated a fully subtractive method, involves removing selected portions of metal after a continuous metal layer has been deposited. Thus, successive sublayers of titanium, copper and titanium are built up by conventional sputtering techniques on the underlying polymer film 20. Alternatively, the copper sublayer may be formed on the first-deposited titanium sublayer by sputtering only a thin sublayer of copper and then building up the copper thickness by a standard electroplating technique. Thereafter, the second sublayer of titanium is sputtered on the aforesaid copper sublayer. The three sublayers so deposited jointly form metal layer 24, which also lines the interior walls of via holes 25 and extends through these holes into electrical contact with the exposed metal surfaces below. Thus, the metal-lined holes electrically connect metal layer 24 with interconnection pads 14. A conventional photoresist is applied as a coating, and is then irradiated with a laser beam in a particular pattern and developed into a mask to allow etching. Subsequently, selected portions of the metal layer are etched away to expose sections of the polymer film and to form raised metal lands on predetermined areas of the film, such as lands 22 shown in FIG. 2, and the photoresist mask is then removed. Metal layer 24 shown in FIG. 1 comprises the raised, discrete lands that form a pattern of metallization on polymer film 20.

An alternative method, termed semi-additive, for forming the metal lands involves first sputtering a thin sublayer of titanium onto the entire surface of polymer film 20 of the structure shown in FIG. 3b, followed by sputtering a thin sublayer of copper, and subsequently applying a known photoresist compound. Using a laser beam, the photoresist is irradiated according to the pattern desired for the metal lands which are to be formed. The photoresist is then developed into a mask and, subsequently, the portions of the copper sublayer which are unprotected by photoresist are further built-up by electroplating. Another metal sublayer, such as nickel or gold, is then deposited onto the copper by electroless or electrolytic plating. The thin sublayers of titanium and copper having unexposed photoresist are then removed from the polymer film, again by conventional etching techniques.

The third method for forming metal layer 24, of FIG. 3d, is called fully additive and permits deposition of discrete metal lands directly on predetermined areas of underlying polymer film 20. In the process, palladium acetate is dissolved in a 1% solution of chloroform (CHCl₃) and sprayed or spun on the polymer film to provide a thin coat over the entire exposed surface. The surface is then selectively irradiated with a laser beam, causing the palladium acetate to decompose and deposit a palladium film of no more than a few monolayers in those areas receiving the radiation. The palladium acetate that has not decomposed is removed by dissolving it in chloroform. Finally, a copper layer is formed in those areas that have the palladium film by immersion of the module in an electroless copper plating solution.

Following the build-up of the last multiple ply sequence to be applied, an outer coating is deposited over electrical interconnection structure 9, as shown in FIG. 1a. By the CVD ALE method described earlier, an inorganic oxide barrier film is deposited directly on top surface 35 and on all sides of the electrical interconnection structure. The inorganic oxide film so deposited may extend beyond the sides of the electrical interconnection structure to cover part of the upper surface of the substrate. Subsequently, a dielectric polymer is applied preferably as a solid film on the portion of the barrier film overlying top surface 35 and is then bonded thereto as described earlier.

The present invention provides an electrical circuit module, incorporating an HDI structure, wherein penetration of moisture is effectively prevented. The resultant module is smaller, lighter and simpler to fabricate using small amounts of commonly available materials than modules heretofore available. It will be apparent to those skilled in the art that the present invention is not limited to the specific embodiments herein disclosed. For example, it will be understood that the number of circuit components, arrangement of the components, and placement of the interconnection pads will depend on the particular module desired. As such, the present invention may accommodate electrical circuit components of varying sizes and shapes and also different chip materials and technologies, such as gallium arsenide or others. Further, while the number of multiple ply sequences in the module typically falls between two and four inclusive, the present invention is not so limited and additional sequences may be used when necessary or desirable.

While the invention has been described in detail herein in accordance with certain preferred embodiments thereof, many modifications, substitutions, changes and equivalents will now occur to those skilled in the art. In one such modification, for example, an inorganic oxide barrier film may be deposited by the disclosed low temperature CVD ALE process on the surface of chips fabricated with polymer to precoat the chips before single or multiple chip packaging. It will be understood that once the chips are moisture-proofed they may be used in any type of single or multiple chip module packaging and will have protection against penetration of moisture into the chips themselves. It is intended to cover all such modifications and changes as fall with the true spirit and scope of the present invention by means of the appended claims.

What is claimed is:

1. A moisture-proof, electrical circuit module comprising:
   a substrate;
   at least one electrical circuit component situated free standing on said substrate; and
   an electrical interconnection structure comprising a plurality of multiple ply sequences successively stacked over said at least one component and said substrate, each of said sequences including at least a dielectric polymer film and a metal layer overlying said polymer film;
   at least one of said plurality of sequences further including an inorganic oxide moisture barrier film underlying said polymer film;
   said inorganic oxide moisture barrier film being other than immediately adjacent said at least one component;
   each of said films including a plurality of via holes extending therethrough, each of said holes exposing a metal surface, at least one of said metal surfaces being electrically connected to said circuit component, the interior surface of each of said holes being lined by the metal layer of the corresponding sequence to establish a conductive link between the metal layer of the corresponding sequence and the underlying exposed metal surface;
   whereby electrical connections to said at least one circuit component are established through said via holes and moisture is prevented from penetrating to said circuit component.

2. The module of claim 1 including a plurality of mutually spaced, electrical circuit components situated on said substrate, said electrical connections extending to selected ones of said plurality of circuit components through said via holes.

3. The module of claim 2 wherein in each of said sequences said metal layer comprises metal lands overlying predetermined areas of said dielectric polymer film.

4. The module of claim 3 including interconnection pads disposed on said electrical circuit components, wherein the exposed metal surfaces are presented by said metal lands in all sequences remote from said substrate and the exposed metal surfaces in the sequence adjacent said substrate are presented by said interconnection pads.

5. The module of claim 3 including interconnection pads disposed on said electrical circuit components and on said substrate, wherein the exposed metal surfaces are presented by said metal lands in all sequences remote from said substrate and the exposed metal surfaces in the sequence adjacent said substrate are presented by said interconnection pads.

6. The module of claim 2 and further comprising an outer coating overlying the top and sides of said electrical interconnection structure, said coating including an inorganic oxide moisture barrier film.

7. The module of claim 6 wherein said outer coating further includes a dielectric polymer film overlying a portion of said moisture barrier film, said portion being on the top of said electrical interconnection structure.

8. The module of claim 2 wherein the via holes in successive sequences are out of alignment with respect to each other.

9. The module of claim 2 wherein said substrate has a substantially planar surface including at least one cavity, said cavity having one or more of said circuit components situated therein each spaced from the cavity walls and from all other circuit components in said cavity and being disposed in said cavity at a depth so as to position the top surface of said one or more of said circuit components substantially even with said planar substrate surface, the space surrounding each circuit component being bridged by the dielectric polymer film of the multiple ply sequence disposed adjacent said substrate.

10. The module of claim 9 wherein said polymer film of the sequence disposed adjacent said substrate additionally fills the space surrounding each circuit component within said cavity.

11. In an integrated circuit module:
a substrate;
a plurality of mutually spaced, integrated circuit chips situated on said substrate each including a plurality of interconnection pads;
said substrate including at least one interconnection pad disposed for connection external to said module;
a first film overlying said chips and said substrate comprising an inorganic oxide material;
a second film overlying said first film comprising a dielectric polymer material;
said first and second films containing a plurality of via holes extending therethrough, each of said via holes exposing an interconnection pad beneath said first film; and
a metal layer comprising lands of metal overlying portions of said second film, said lands additionally extending through said via holes to make electrical contact with at least some of the interconnection pads positioned therebelow;
whereby moisture is prevented from penetrating to said chips.

12. A module in accordance with claim 11 wherein said first and second films and said metal layer are components of a first multiple ply sequence;
said module further comprising:
a second multiple ply sequence overlying said first sequence, said second sequence including at least a film of dielectric polymer material having a plurality of via holes extending therethrough, and a metal layer including metal lands overlying portions of the polymer film of said second sequence;
the via holes in said second sequence being out of alignment with respect to the via holes in said first sequence, each via hole in said second sequence further exposing a metal land of said first sequence; and
the metal layer of said second sequence extending through the via holes in the film portion of said second sequence to establish electrical contact between selected lands of said first and second sequences;
whereby at least some of the lands of said first and second sequences serve as conductive links between respective ones of said interconnection pads to establish communication between connected pads and circuitry external to said module.

13. A moisture-proof, electrical circuit module comprising:
a substrate,
at least one electrical circuit component situated free standing on said substrate;
an electrical interconnection structure overlying said circuit component; and
an outer coating overlying the top and sides of said electrical interconnection structure, said outer coating including an inorganic oxide moisture barrier film;
whereby moisture is prevented from penetrating to said at least one circuit component.

14. The module of claim 13 wherein said outer coating further includes a dielectric polymer film overlying said barrier film on the top of said electrical interconnection structure.

15. A moisture-proof, integrated circuit module comprising:
a substrate having a plurality of metal interconnection pads disposed thereon;
a plurality of integrated circuit chips on said substrate, each of said chips having a second plurality of metal interconnection pads disposed thereon; and
an electrical interconnection structure including a plurality of multiple ply sequences successively stacked over said chips and said substrate, each of said sequences including at least a dielectric polymer film and a metal layer comprising metal lands overlying predetermined areas of said polymer film, at least some of said plurality of sequences further including an inorganic oxide moisture barrier film underlying said polymer film thereof;
said substrate having a substantially planar surface including at least one cavity having one or more of said chips situated therein, each of said chips having its top surface at a level substantially even with said planar substrate surface and being free standing within said cavity such that the space surrounding each of said chips is bridged by the polymer film of the sequence disposed adjacent said substrate;
each of said plurality of sequences having a plurality of via holes extending through the entire film portion thereof, the via holes of said sequence disposed adjacent said substrate exposing selected pads on said substrate and on said chips, and the via holes of all sequences remote from said substrate exposing the metal lands of the sequence immediately underneath;

in each of said sequences the interior surfaces of the via holes being lined by the metal layer thereof to establish a conductive link between the last-recited metal layer and the exposed metal, so that said metal lands conductively link respective ones of said interconnection pads to establish communication between connected pads and circuitry external to said module; and an outer coating overlying the electrical interconnection structure of said module and including an additional inorganic oxide moisture barrier film directly overlying the top and sides of said electrical interconnection structure, and a dielectric polymer film overlying said additional moisture barrier film on the top of said electrical interconnection structure;

whereby moisture is prevented from penetrating to said chips.

* * * * *